United States Patent [19]

Hodges

[11] Patent Number: 5,775,510
[45] Date of Patent: *Jul. 7, 1998

[54] UV LIGHT SENSITIVE DIE-PAC FOR SECURING SEMICONDUCTOR DICE DURING TRANSPORT

[75] Inventor: Joe Hodges, Boise, Id.

[73] Assignee: Micron Technology, Inc., Boise, Id.

[ * ] Notice: The term of this patent shall not extend beyond the expiration date of Pat. No. 5,590,787.

[21] Appl. No.: 659,268

[22] Filed: Jun. 6, 1996

Related U.S. Application Data

[63] Continuation of Ser. No. 368,516, Jan. 4, 1995, Pat. No. 5,590,787.

[51] Int. Cl.⁶ .................. B65D 85/30; B65D 73/00
[52] U.S. Cl. .................. 206/724; 706/460; 706/701
[58] Field of Search .................. 206/701, 707, 206/711, 713, 717–720, 722–725, 460; 220/324; 53/428

[56] References Cited

U.S. PATENT DOCUMENTS

| | | | |
|---|---|---|---|
| 3,645,281 | 2/1972 | Seidler | 206/722 X |
| 3,695,414 | 10/1972 | Wiesler et al. | 206/460 X |
| 4,251,712 | 2/1981 | Parr | 206/460 X |
| 4,478,331 | 10/1984 | Ruin | 206/707 |
| 5,025,922 | 6/1991 | Havens et al. | 206/720 |
| 5,025,923 | 6/1991 | Okui | 206/460 X |
| 5,054,610 | 10/1991 | Ajello | 220/324 X |
| 5,064,064 | 11/1991 | Itou et al. | 206/719 X |
| 5,158,818 | 10/1992 | Aurichio | 206/460 X |
| 5,234,104 | 8/1993 | Schulte et al. | 206/714 |
| 5,234,105 | 8/1993 | Sato et al. | 206/714 X |
| 5,447,784 | 9/1995 | Williams et al. | 206/719 X |
| 5,590,787 | 1/1997 | Hodges | 206/724 |

*Primary Examiner*—Bryon P. Gehman
*Attorney, Agent, or Firm*—Trask, Britt & Rossa

[57] ABSTRACT

A structure for protecting semiconductor integrated microcircuit dice during shipping. The structure secures the position of the die atop an ultraviolet (UV) light penetratable plate using a UV light sensitive adhesive layer. Once the structure reaches its destination, prior to removal of the die, the adhesive layer is exposed to ultraviolet light. This exposure reduces the adhesiveness or coefficient of friction of the layer, thereby facilitating die removal from the structure. The UV sensitive adhesive does not leave contaminating silicon residue on the removed die. The invention may be realized using currently commercially available UV tape and a modified die-pac having a UV light penetratable window.

33 Claims, 4 Drawing Sheets

5,775,510

1

UV LIGHT SENSITIVE DIE-PAC FOR SECURING SEMICONDUCTOR DICE DURING TRANSPORT

This is a continuation of application Ser. No. 08/368,516, filed Jan. 4, 1995, now U.S. Pat. No. 5,590,787.

FIELD OF THE INVENTION

This invention relates to semiconductor integrated microcircuit manufacturing and more particularly to temporarily packaging singulated integrated circuit dice for shipping.

BACKGROUND OF THE INVENTION

Semiconductor integrated circuit chips are typically constructed en masse on a single wafer of silicon or other semiconductor material. After the circuits are created, the wafers are split up or singulated into individual integrated circuit chips or dice. Typically, each die is then individually encapsulated into integrated circuit packages which are capable of being attached to printed Circuit boards. However, dice are often sold or transferred to other manufacturing sites in the unpackaged form. The unpackaged dice must therefore be shipped through the mail or other freight means to destinations which can be cities, states or by even countries apart. Freight travel often involves subjecting articles to harsh environments with respect to dirt and dust, and mechanical shock and vibration. This requires that the dice be temporarily packaged to protect them from exposure to these environments.

Over the years, the industry has developed packages called die-pacs which temporarily contain the dice during shipping. Currently, die-pacs are protective containers similar to that shown in FIG. 1. The containers are made of black conductive polypropylene to keep out dust and other contaminants and to protect the die from static charges and from crushing and impact type forces caused by rough handling. The container comprises a lower bed structure 1 which is capable of being mated to a cover structure 2. When mated, an inner cavity 3 is formed for storing the die 4 or dice. The bed and cover are held together through temporary securing means such as interlocking clasp brackets 5 and 6. The position of the die within the cavity of the container is secured by a layer of silicon gel adhesive material 7 contacting the undersurface of the die and a surface of the bed facing the inner cavity.

The silicon gel is similar to common household cellophane wrapping material. However, silicon gel has greater resiliency and will not hold a static electric charge of any significance.

Prior to shipping, the singulated dice are placed atop the silicon gel layer on the bed through robot deposit or other means. The cover is then mated and secured to the bed using the interlocking clasp brackets. The die-pac is then ready for shipment.

Upon arrival of the die-pac at its destination, the interlocking clasp brackets are removed and the cover lifted from the bed. Robot-operated pickup means then remove the die or dice from the bed.

There are, however, certain problems which have arisen using the popular silicon gel die-pac. First, the adhesive nature of the silicon gel which is strong enough to maintain the position of the die during transport requires either expensive manual removal of the dice or that the robot pickup means be sufficiently strong to remove the die from the gel. This relatively powerful pickup means sometimes can damage the sensitive die during the pickup operation.

2

When less strong means are used, there are often many unsuccessful attempts made before the die is pickedup. Repetitive attempts to pick up a die increases the probability of damaging the die during the pickup process.

Second, it has been found that residue from the silicon gel often contaminates portions of the die. This residue is in the form of silicone compounds such as silicone oxides and silicone-metal compounds. Tests have shown particularly high concentrations of compounds such as polydimethylsiloxane $(CH_3-(Si-O)_n-CH_3)$. These compounds generally contaminate the surfaces of a die, resulting most commonly in reduced conductivity of the die's electrical contact points, thereby forcing further costly processing prior to packaging. Severe contamination will even cause a die to be non-functional.

Therefore, it would be valuable to have a method for shipping singulated dice which does not subject the dice to the problems associated with the current prior art.

SUMMARY OF THE INVENTION

It is a primary and secondary object of this invention to provide a method for inexpensively protecting singulated dice during shipping which does not result in contaminated or damaged dice after removal.

It is a further object of this invention to utilize current die-pac structural designs so as to minimally impact the current automation devices for loading and removing dice from shipping die-pacs.

It is a further object of this invention to provide a die-pac which allows less powerful means for removing the dice from the die-pac after it has reached its destination.

These and other objects are achieved by a structure having an ultra violet (UV) light transparent plate upon which has been placed a layer of UV-light sensitive adhesive for securing the position of the die or dice during shipping. The adhesive is sensitive to UV light in that its adhesiveness, stickiness or coefficient of friction is alterable by exposing the adhesive to UV light. Upon arrival of the structure at its destination, the adhesive is subjected to a UV-light source, thereby reducing its adhesiveness, and allowing for less powerful pickup of the dice during removal. The specific adhesive used provides less harmful silicon residues to the dice during shipping.

The structure is readily adaptable to current die-pac designs having a matable bed and cover for enclosing the die or dice for protection during shipping.

DESCRIPTION OF THE PREFERRED EMBODIMENT OF THE INVENTION

Figure 1:
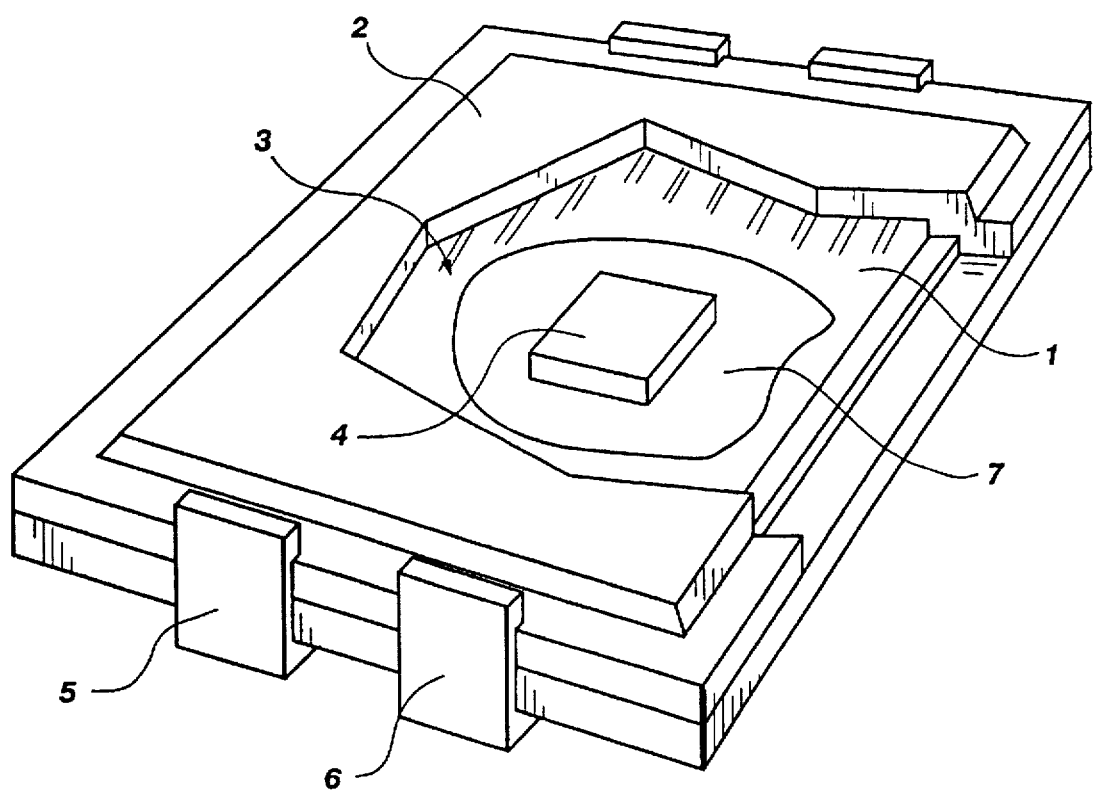
FIG. 1 is a perspective cut-away view of a prior art die-pac using silicon gel adhesive as the die-securing means.
Figure 2:
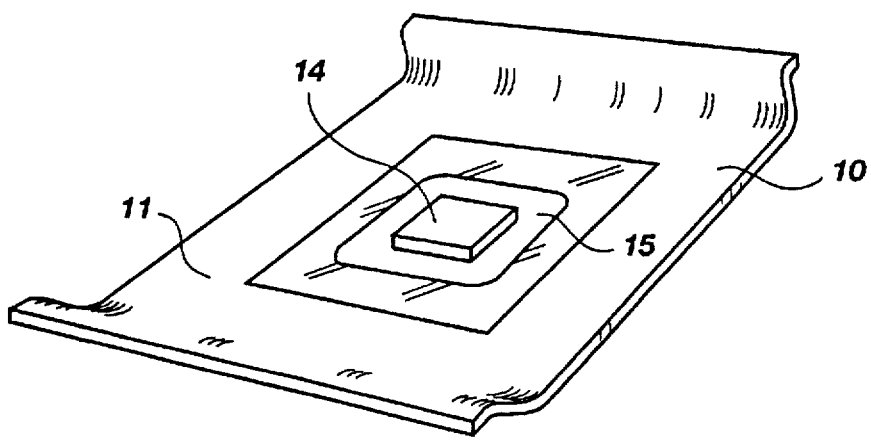
FIG. 2 is a perspective view of a die holding bed according to the invention.
Figure 3:
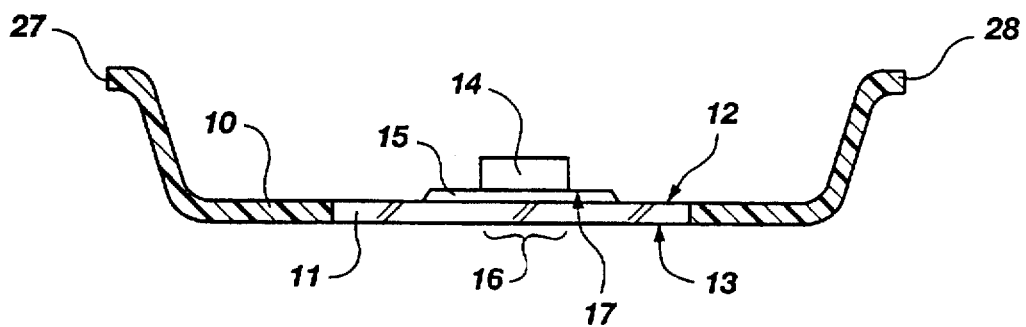
FIG. 3 is a cross-sectional end view of the die holding bed of FIG. 2.

Referring now to the drawing, FIGS. 2 and 3 respectively show a perspective view and a cross-sectional end view of a structure according to the invention for releasably holding a microcircuit die. The structure comprises a bed structure 10 made of substantially rigid conductive material such as black conductive polypropylene. A portion of the bed forms a plate 11 made of material which is penetratable by ultraviolet (UV) light, such as substantially clear plastic, glass or polycarbonate. The plate has an upper face 12 and a lower face 13. The position of the die 14 is secured above a section 16 of the plate 11 by a layer of ultraviolet light sensitive adhesive 15 contacting the undersurface 17 of the die.

Upon arrival of the holding structure at its destination, the lower face 13 of the plate portion of the bed is subjected to UV-light of sufficient intensity. The light penetrates through the plate and into the UV light sensitive adhesive layer existing between the die and the upper face of the plate. This exposure reduces the coefficient of friction of the adhesive. The die can then be easily removed through vacuum pick-up means.

Figure 4:
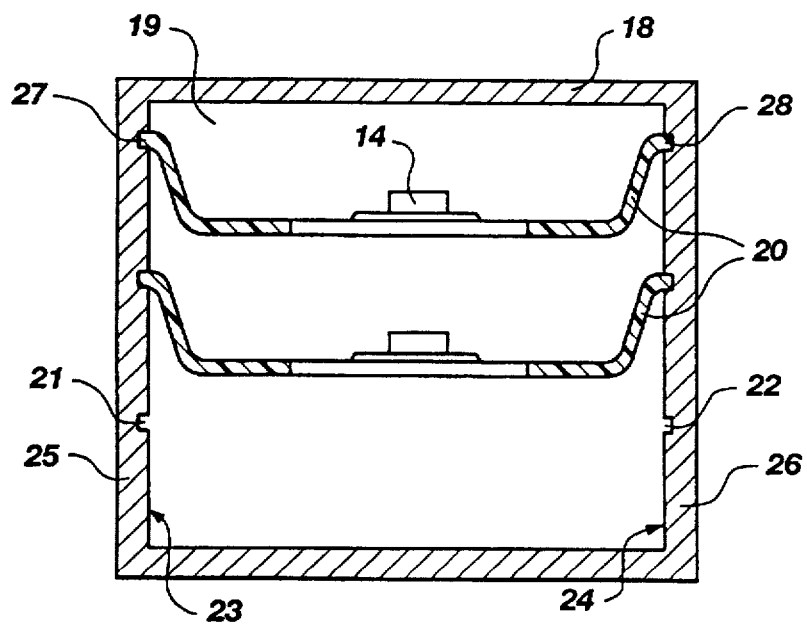
FIG. 4 is a cross-sectional end view of a vessel structure capable of containing one or more die holding beds during shipping.

FIG. 4 shows that one or more of the holding beds may be loaded into a vessel structure 18 to further protect the die 14 or dice from the shipping environment which may include dust, heat, shock, vibration and static charges. The structure comprises at least one cavity 19 capable of enclosing a die or dice, and means for securing the position of the die or dice within the cavity. In this case, the vessel may contain a plurality of holding beds 20. The means for securing comprise a pair of parallel grooves 21, 22 for each holding bed to be loaded into the vessel. Each pair of grooves is set into the inner surface 23, 24 of parallel walls 25, 26 of the vessel. The grooves are sized and dimensioned to releasably engage opposite ends 27, 28 of a holding bed 20. Upon arrival of the vessel at its destination, the vessel may be opened and the holding beds removed to be irradiated.

Figure 5:
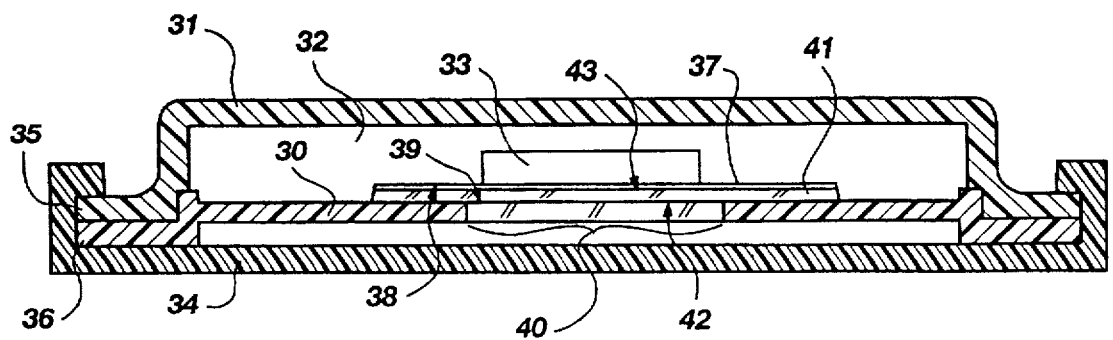
FIG. 5 is a cross-sectional end view of a die-pac according to the invention.

An alternate embodiment of the invention is directed toward implementation of the invention using the typical, currently used die-pac structure. FIG. 5 shows a cross-sectional end view of a typical die-pac structure. The die-pac is a container which comprises a lower bed structure 30 which is capable of being mated to a cover structure 31. The cover and the bed are made of protective hard conductive material such as black conductive polypropylene. Once mated, an inner cavity 32 is formed between the bed and cover. The cavity is sized and dimensioned to contain the die 33 therein. The bed and cover are held together through temporary securing means such as interlocking clasp brackets 34 which engage the edge flanges 35, 36 of the mated bed and cover.

The position of the die within the cavity of the container is held by a layer of ultraviolet light sensitive adhesive 37 contacting the undersurface 38 of the die and secured over the upper face 39 of a plate portion 40 of the bed. As in the previous embodiment, the plate portion is made of UV light penetratable material such as transparent plastic, glass, or polycarbonate.

In this embodiment, the adhesive layer is formed using ultraviolet sensitive tape (UV tape) of the type which is currently used to hold IC wafers firmly in place during the singulation process. UV tape typically comprises a layer of ultraviolet curable pressure sensitive adhesive 37 such as acrylic attached to a UV penetratable polyvinyl chloride backing 41. The backing has an undersurface 42 which is secured above the upper face of the plate and a top surface 43 which carries the UV sensitive adhesive 37. The undersurface may be secured directly to the upper face using any number of means available in the art such as epoxy. However, the means used must not substantially interfere with the penetration of UV light through the plate and onto the UV sensitive adhesive.

UV tape is currently available from suppliers such as Kanematsu USA, Inc., of New York, N.Y. under the brand name Furukawa UV Tape; Uniglobe Kisco, Co., of Santa Clara, Calif., under the brand name Bando Dicing Tape; and others. Although UV sensitive adhesive tape is the preferred adhesive, other EMR sensitive adhesives such as glues and gels may be used in place of the UV tape without departing from the invention.

Figure 6:
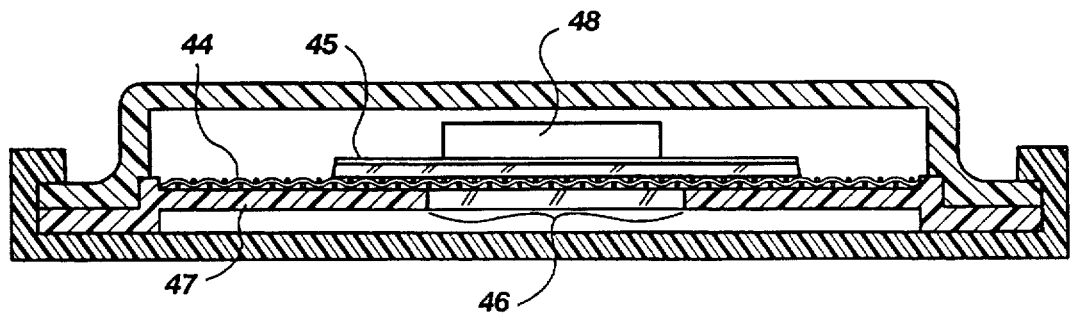
FIG. 6 is a cross-sectional end view of an alternate embodiment of a die-pac constructed according to the invention having a nylon web interposed between the tape and the bed surface.

FIG. 6 shows an alternate embodiment of the invention wherein a layer of webbing material 44 has been interposed between a UV sensitive adhesive layer 45 and a UV penetratable plate portion 46 of a support bed 47. The webbing further protects the die 48 from mechanical shock. The webbing must either be made from UV transparent material or woven coarse enough to allow UV light to pass through to the tape. The webbing is preferably made of nylon.

Figure 7:
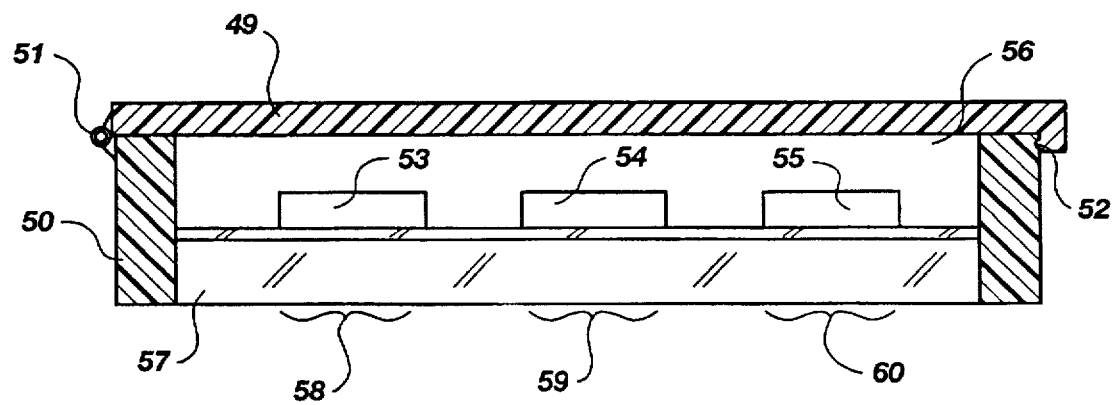
FIG. 7 is a cross-sectional end view of an alternate embodiment of a die-pac constructed according to the invention showing multiple dice and a bed portion made completely of transparent material.

FIG. 7 shows an alternate embodiment of the invention wherein different means are used to attach a die-pac cover 49 to a bed structure 50. Here is shown a hinged connection 51 between the bed and cover which can be snapped closed using a common prong/detent snap mechanism 52. This embodiment is included to show that many well known means for releasably enclosing dice may be used without departing from the invention.

This embodiment further shows that more than one die 53, 54 and 55 may be placed within the cavity 56 formed between the cover and bed of the die-pac. The UV penetratable plate portion 57 of the bed is shown extending across the length of the cavity. This is not required. All that is required is that sections 58, 59 and 60 of the bed located beneath the dice be capable of passing UV light and allowing the adhesive layer to be exposed.

In general, any means for containing the dice may be used without departing from the invention so long as those means allow for the penetration of electromagnetic radiation which will reduce the coefficient of friction of the adhesive layer.

As stated above, all of the structure below the adhesive layer must be penetratable by the UV light, including the UV tape backing. When webbing is used, it must be penetratable. In this respect, the structure below the adhesive layer may be referred to collectively as the EMR penetratable "plate" portion.

The pre-exposure stickiness, level of adhesion or coefficient of friction of the UV-sensitive adhesive should generally be strong enough to securely hold the dice during the rigors of shipping, and be weak enough after exposure and curing to allow for vacuum pick-up. The adhesive should not contain a significant concentration of any undesirable compounds which would result in contamination of the die or dice.

X-ray photoelectron spectroscopy (XPS) tests performed on dice exposed to an amount of silicone gel and dice exposed to a comparable amount of UV tape reveal generally that the UV tape exhibits about one half the amount of contamination of silicone gel.

Although UV light is used in the preferred embodiment, other types of electro-magnetic radiation may be used so long as the plate portion is penetratable by it and the adhesive layer is sensitive to it. For the commercially available UV sensitive adhesive tape disclosed above and for most clear plastic, glass or polycarbonate, UV light having a wavelength of between 250 and 350 nanometers has been found to be adequate.

Figure 8:
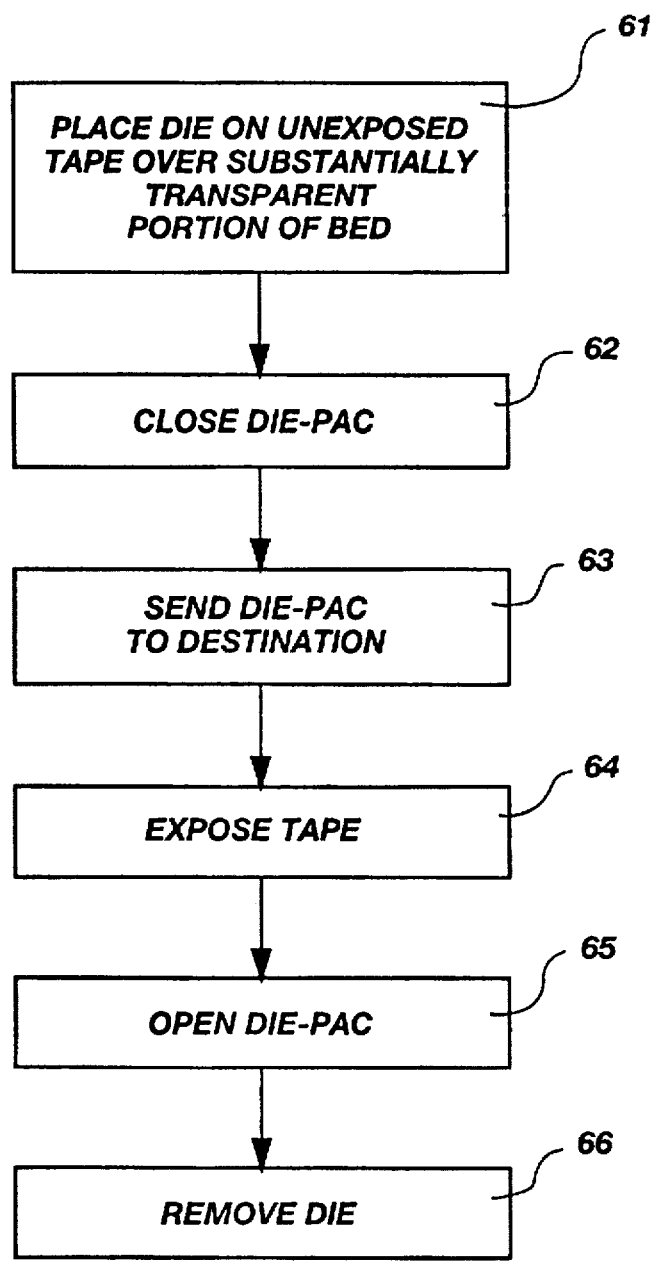
FIG. 8 is a block diagram of the steps necessary for shipping singulated dice according to the invention.

FIG. 8 shows the process steps necessary in transporting or shipping a singulated die according to the invention. The process begins with placing 61 the die on an unexposed UV sensitive layer of adhesive such as UV tape attached to the upper surface of a substantially transparent portion of a bed. The term "substantially transparent" in this specification means that the portion is capable of passing through UV light with a satisfactorily low amount of attenuation. The next step involves enclosing 62 the die within the die-pac and sending 63 the die-pac to its destination. During transport the die-pac should not be irradiated by any UV light source. This is usually accomplished by placing the die-pac within an opaque antistatic bag. Upon arrival, there are the steps of: exposing 64 a portion of the tape existing between the die and the substantially transparent portion of the bed to electromagnetic radiation in the form of ultraviolet light; opening 65 the die-pac; and removing 66 the die from the die-pac.

The exposing step may occur prior to or after the opening step of the die-pac.

While the preferred embodiments of the invention have been described, modifications can be made and other embodiments may be devised without departing from the spirit of the invention and the scope of the appended claims.

What is claimed is:

1. A structure for releasably holding at least one microcircuit die, comprising:

a plate having an upper face and formed at least partially from a material which is penetrable by electromagnetic radiation; and a layer of adhesive over a section of said upper face, said layer of adhesive having a coefficient of friction sensitive to electromagnetic radiation, whereby at least one die held in a fixed position with respect to said upper face by said layer of adhesive may be released by exposing said layer of adhesive proximate the at least one die to electromagnetic radiation through said section.

2. The structure of claim 1, further including a segment of tape held in relatively fixed relation to said upper face and having said layer of adhesive over at least a portion thereof, said segment of tape being formed from a material which is penetrable by electromagnetic radiation.

3. The structure of claim 2, further including a webbing positioned between said upper face and said segment of tape, said webbing formed to be penetrable by electromagnetic radiation.

4. The structure of claim 3, wherein said webbing is comprised of nylon.

5. The structure of claim 1, further including a cover extending over and in relatively fixed relation to said upper face of said plate.

6. The structure of claim 1, wherein said coefficient of friction of said layer of adhesive is decreased by exposure to electromagnetic radiation.

7. The structure of claim 6, wherein said electromagnetic radiation includes a form of light.

8. The structure of claim 7, wherein said electromagnetic radiation includes ultraviolet light.

9. A structure for releasably holding at least one semiconductor die, comprising:

a plate having an upper face, at least a portion of said plate penetrable by electromagnetic radiation; and an electromagnetic radiation-sensitive adhesive applied to at least a section of said upper face over said at least a portion of said plate.

10. The structure of claim 9, wherein said at least a portion of said plate includes at least one aperture therethrough.

11. The structure of claim 9, wherein said at least a portion of said plate includes a material substantially penetrable by electromagnetic radiation.

12. The structure of claim 9, further including an electromagnetic radiation penetrable layer proximate said upper face and extending substantially over said portion of said plate being penetrable by electromagnetic radiation.

13. The structure of claim 12, wherein said electromagnetic radiation penetrable layer includes an electromagnetic radiation-penetrable tape positioned between said upper face and said electromagnetic radiation-sensitive adhesive.

14. The structure of claim 12, further including a layer of webbing positioned between said upper face and said electromagnetic radiation-penetrable layer, said layer of webbing being penetrable by electromagnetic radiation.

15. The structure of claim 9, wherein said electromagnetic radiation-sensitive adhesive is sensitive to a form of light.

16. The structure of claim 9, wherein said electromagnetic radiation-sensitive adhesive is sensitive to ultraviolet light.

17. The structure of claim 9, further including a cover releasably attached to said plate and forming a chamber between said cover and said upper face of said plate proximate said at least a portion of said plate.

18. The structure of claim 17, wherein at least one die is positioned within said chamber.

19. The structure of claim 9, wherein said adhesive possesses an adhesiveness which is significantly reducible when exposed to electromagnetic radiation.

20. A package for transporting at least one die, said package comprising:

a bed, at least a portion of which is substantially penetrable by electromagnetic radiation, said bed having an upper face;

a cover releasably mated to said bed and defining an inner chamber therewith, said inner chamber being sufficiently sized to accept at least one die therein; and an adhesive proximate said upper face releasably holding at least one die in a relatively fixed position within said inner chamber, said adhesive having a first adhesiveness alterable to a second adhesiveness by exposure of said adhesive to electromagnetic radiation.

21. The package of claim 20, wherein said at least a portion includes an aperture through said bed.

22. The package of claim 20, wherein said at least a portion is formed of a material substantially penetrable by electromagnetic radiation.

23. The package of claim 20, wherein said first adhesiveness is greater than said second adhesiveness.

24. The package of claim 20, wherein said first adhesiveness is alterable to said second adhesiveness by exposure to a form of light.

25. A method of attaching and removing at least one integrated circuit die from a container, comprising:

providing a container;

providing an electromagnetic radiation-sensitive adhesive having a first adhesiveness within said container;

adhering at least one die to said electromagnetic radiation-sensitive adhesive;

exposing said electromagnetic radiation-sensitive adhesive to a form of electromagnetic radiation that reduces said first adhesiveness of said electromagnetic radiation-sensitive adhesive to a second adhesiveness; and removing said at least one adhered die from said adhesive having said second adhesiveness.

26. The method of claim 25, including exposing said electromagnetic radiation-sensitive adhesive through a wall of said container.

27. The method of claim 25, including exposing said electromagnetic radiation-sensitive adhesive to a form of light.

28. The method of claim 27, including exposing said electromagnetic radiation-sensitive adhesive to ultraviolet light.

29. The method of claim 28, including exposing said electromagnetic radiation-sensitive adhesive to ultraviolet light having a wavelength of between 250 and 350 nanometers.

30. A method of removing at least one integrated circuit die from a container, comprising:

providing a container having an electromagnetic radiation-sensitive adhesive therein, said electromagnetic radiation-sensitive adhesive securing at least one die to said container;

exposing said electromagnetic radiation-sensitive adhesive proximate said at least one die to electromagnetic radiation to decrease an adhesiveness of said electromagnetic radiation-sensitive adhesive; and removing said at least one die from said container associated with said exposed electromagnetic radiation-sensitive adhesive.

31. The method of claim 30, including radiating electromagnetic radiation through an aperture in said container to expose at least a portion of said electromagnetic radiation-sensitive adhesive to electromagnetic radiation.

32. The method of claim 30, including radiating an electromagnetic radiation penetrable wall of said container with electromagnetic radiation to decrease said adhesiveness of said electromagnetic radiation-sensitive adhesive.

33. The method of claim 30, further including exposing at least a portion of said electromagnetic radiation-sensitive adhesive to a form of light.

* * * * *

UNITED STATES PATENT AND TRADEMARK OFFICE
CERTIFICATE OF CORRECTION

PATENT NO. : 5,775,510
DATED : July 7, 1998
INVENTOR(S) : Joe Hodges

It is certified that error appears in the above-identified patent and that said Letters Patent is hereby corrected as shown below:

| | | |
|---|---|---|
| Column 1 | line 23 | after "or" insert --by--. |
| Column 1 | line 24 | after "or" delete --by--. |
| Column 2 | line 2 | change "pickedup" to --picked up--. |
| Column 3 | line 22 | change "UV-light" to --UV light--. |
| Column 3, | line 33 | after "dice" delete the comma. |

Signed and Sealed this

First Day of February, 2000

Attest:

Q. TODD DICKINSON

*Attesting Officer*  *Acting Commissioner of Patents and Trademarks*